(12) United States Patent
Montero et al.

(10) Patent No.: US 11,416,055 B2
(45) Date of Patent: Aug. 16, 2022

(54) COMPENSATING BATTERY HEALTH READINGS AT LOW TEMPERATURES

(71) Applicant: Dell Products, L.P., Round Rock, TX (US)

(72) Inventors: Adolfo S. Montero, Pflugerville, TX (US); Shao-Szu Ho, New Taipei (TW); Jui Chin Fang, Taipei (TW); Chia-Liang Lin, Taipei (TW)

(73) Assignee: Dell Products, L.P., Round Rock, TX (US)

( * ) Notice: Subject to any disclaimer, the term of this patent is extended or adjusted under 35 U.S.C. 154(b) by 250 days.

(21) Appl. No.: 16/898,869

(22) Filed: Jun. 11, 2020

(65) Prior Publication Data
US 2021/0389814 A1   Dec. 16, 2021

(51) Int. Cl.
| | |
|---|---|
| G06F 1/28 | (2006.01) |
| H02J 7/00 | (2006.01) |
| G01R 31/387 | (2019.01) |
| G01R 31/392 | (2019.01) |
| G01R 31/367 | (2019.01) |
| G01R 31/374 | (2019.01) |

(52) U.S. Cl.
CPC ............ *G06F 1/28* (2013.01); *G01R 31/367* (2019.01); *G01R 31/374* (2019.01); *G01R 31/387* (2019.01); *G01R 31/392* (2019.01); *H02J 7/005* (2020.01); *H02J 7/0048* (2020.01)

(58) Field of Classification Search
None
See application file for complete search history.

(56) References Cited

U.S. PATENT DOCUMENTS

| | | | |
|---|---|---|---|
| 2007/0194756 A1* | 8/2007 | Cutrona | H02J 7/0047 320/132 |
| 2010/0244846 A1* | 9/2010 | Desprez | G01R 31/392 324/427 |
| 2015/0162768 A1* | 6/2015 | Okuda | G01R 31/392 320/134 |
| 2020/0233037 A1* | 7/2020 | Yamamoto | G01R 31/392 |

* cited by examiner

*Primary Examiner* — Jas A Sanghera
(74) *Attorney, Agent, or Firm* — Fogarty LLP

(57) ABSTRACT

Systems and methods for compensating battery health readings at low temperatures are described. In some embodiments, an Information Handling System (IHS) may include: a processor and a memory coupled to the processor, the memory having program instructions stored thereon that, upon execution by the processor, cause the IHS to: calculate a state-of-health (SOH) of a battery, and compensate the SOH, at least in part, by taking into account at least one temperature measured during a charge cycle.

15 Claims, 5 Drawing Sheets

| | | | |
|---|---|---|---|
| GAS GAUGING | SoH WEIGHT | MAXIMUM DEGRADE | % |
| GAS GAUGING | SoH WEIGHT | 100% TEMPERATURE | 1degC |
| GAS GAUGING | SoH WEIGHT | MAXIMUM DEGRADE TEMPERATURE | 1degC |

| | | Cycle1 | | | | Cycle2 | | | | Cycle3 | | |
|---|---|---|---|---|---|---|---|---|---|---|---|---|
| | ROSC | SoH FACTOR | FCC (cWh) | CALCULATIVE SOH | REPORT SOH | SoH FACTOR | FCC (cWh) | CALCULATIVE SOH | REPORT SOH | SoH FACTOR | FCC (cWh) | CALCULATIVE SOH | REPORT SOH |
| | 100% | 83% | 5700 | / | 95% | 83% | 5505 | / | 100% | 83% | 5311 | / | 96% |
| | 75% | 88% | 5700 | / | 95% | 88% | 5505 | / | 100% | 88% | 5311 | / | 96% |
| | 50% | 89% | 5700 | / | 95% | 88% | 5505 | / | 100% | 88% | 5311 | / | 96% |
| | 25% | 90% | 5700 | / | 95% | 90% | 5505 | / | 100% | 89% | 5311 | / | 96% |
| | 7(UPDATE POINT) | 90% | 5505 | 104% | 100% | 90% | 5311 | 101% | 96% | 90% | 5116 | 97% | 96% |
| | SoH FACTOR (AVERAGE) | 88% | / | | | 88% | / | | | 88% | / | | |
| DESIGN CAPACITY (cWh) | 6000 | | | | | | | | | | | | |

# COMPENSATING BATTERY HEALTH READINGS AT LOW TEMPERATURES

FIELD

The present disclosure relates generally to Information Handling Systems (IHSs), and more particularly, to systems and methods for compensating battery health readings at low temperatures.

BACKGROUND

As the value and use of information continue to increase, individuals and businesses seek additional ways to process and store it. One option available to users is Information Handling Systems (IHSs). An IHS generally processes, compiles, stores, and/or communicates information or data for business, personal, or other purposes thereby allowing users to take advantage of the value of the information. Because technology and information handling needs and requirements vary between different users or applications, IHSs may also vary regarding what information is handled, how the information is handled, how much information is processed, stored, or communicated, and how quickly and efficiently the information may be processed, stored, or communicated. The variations in IHSs allow for IHSs to be general or configured for a specific user or specific use such as financial transaction processing, airline reservations, enterprise data storage, or global communications. In addition, IHSs may include a variety of hardware and software components that may be configured to process, store, and communicate information and may include one or more computer systems, data storage systems, and networking systems.

Examples of portable IHSs include notebook computers, tablet components, mobile phones, and personal data assistants (PDAs). Portable IHSs are typically powered by an external alternating current (AC) power source supplied by an AC adapter when connected to an AC power source (i.e., when the system is "plugged in") and by rechargeable batteries (e.g., lithium ion or nickel metal hydride battery packs) when disconnected from the AC power source (i.e., when the system is "unplugged" or in "mobile use"). In some cases, a portable IHS may also receive power supplied via a wired bus (e.g., Universal Serial Bus or "USB" Type-C) or wirelessly via an inductive charging pad. In various implementations, an IHS's rechargeable battery may be used as a supplemental or dual power source when the IHS is plugged in and connected to another power source.

During a battery's lifetime, it is normal for its performance or "health" to deteriorate gradually due to internal physical and chemical changes that take place with use and aging. To monitor whether its battery is functioning properly, an IHS measures one or more of the battery's properties and produce a battery health indicator based on those properties.

However, as the inventors hereof have discovered, in some portable IHSs, for example those that use lithium ion batteries, the value of a battery health indicator can vary depending upon ambient temperature. Particularly, IHSs running in cold environments produce much-worse-than-expected battery health indicators.

The inventors hereof have recognized that the aforementioned battery health indicator issue occurs due to certain the chemical behavior of battery cells which, at lower temperatures, exhibit a higher impedance than at room temperature. The higher impedance can cause the IHS to mistakenly identify the battery as being an aged battery, when in fact the battery is fine but its operating temperature is lower than typical ambient temperatures. These inaccurate battery health readings can cause unnecessary customer returns and loss of faith the manufacturer's brand.

SUMMARY

Systems and methods for compensating battery health readings at low temperatures are described. In an illustrative, non-limiting embodiment, an Information Handling System (IHS) may include: a processor and a memory coupled to the processor, the memory having program instructions stored thereon that, upon execution by the processor, cause the IHS to: calculate a state-of-health (SOH) of a battery, and compensate the SOH, at least in part, by taking into account at least one temperature measured during a charge cycle.

In some cases, the processor may include an embedded controller (EC). Additionally, or alternatively, the processor comprises a Battery Management Unit (BMU). To calculate the SOH, the program instructions, upon execution, may cause the IHS to divide a present charge capacity after a full charge cycle by an original charge capacity. To take into account the at least one temperature, the program instructions, upon execution, may cause the IHS to measure two or more temperature readings at different values of Relative State of Charge (RSOC). For example, the different values of RSOC may include: 100%, 75%, 50%, 25%, and 7%.

Additionally, or alternatively, to take into account the at least one temperature, the program instructions, upon execution, may cause the IHS to: calculate an average of the two or more temperature readings; calculate or select a temperature factor based on the average; and multiply the SOH by the temperature factor to compensate the SOH. The temperature factor may be derived from performance curves indicating temperature-induced variation in cell capacity due to cell impedance changes over a temperature range.

In another illustrative, non-limiting embodiment, a method may include calculating an SOH of a battery and compensating the SOH, at least in part, by taking into account at least one temperature measured during a charge cycle. In yet another illustrative, non-limiting embodiment, a memory storage device may have program instructions stored thereon that, upon execution by one or more processors of an IHS, cause the IHS to: calculate an SOH of a battery and compensate the SOH, at least in part, by taking into account at least one temperature measured during a charge cycle.

BRIEF DESCRIPTION OF THE DRAWINGS

The present invention(s) is/are illustrated by way of example and is/are not limited by the accompanying figures, in which like references indicate similar elements. Elements in the figures are illustrated for simplicity and clarity, and have not necessarily been drawn to scale.

FIG. 5 is table illustrating example parameter settings, according to some embodiments.

FIG. 6 is table illustrating example test results, according to some embodiments.

DETAILED DESCRIPTION

Systems and methods described herein may be used for compensating battery health readings at low temperatures. In some embodiments, these systems and methods may employ a specific temperature compensated register to read a battery's state of health (SOH) indicator. The SOH indicator may be calculated, for example, by comparing the battery's full charge capacity after a charge cycle against the original factory design capacity.

A compensated SOH indicator may be obtained by adjusting the original SOH indicator with a calculated or selected temperature compensation factor that varies with cell temperature for a particular cell's stock keeping unit (SKU) (or other suitable cell identifier). In response to a user's request to inspect its internal battery's state or status, an Information Handling System (IHS) may provide the compensated SOH indicator instead of the original SOH indicator.

For purposes of this disclosure, an Information Handling System (IHS) may include any instrumentality or aggregate of instrumentalities operable to compute, calculate, determine, classify, process, transmit, receive, retrieve, originate, switch, store, display, communicate, manifest, detect, record, reproduce, handle, or utilize any form of information, intelligence, or data for business, scientific, control, or other purposes. For example, an IHS may be a personal computer (e.g., desktop or laptop), tablet computer, mobile device (e.g., Personal Digital Assistant (PDA) or smart phone), server (e.g., blade server or rack server), a network storage device, or any other suitable device and may vary in size, shape, performance, functionality, and price. An IHS may include Random Access Memory (RAM), one or more processing resources such as a Central Processing Unit (CPU) or hardware or software control logic, Read-Only Memory (ROM), and/or other types of nonvolatile memory.

Additional components of an IHS may include one or more disk drives, one or more network ports for communicating with external devices as well as various I/O devices, such as a keyboard, a mouse, touchscreen, and/or a video display. An IHS may also include one or more buses operable to transmit communications between the various hardware components.

Figure 1:
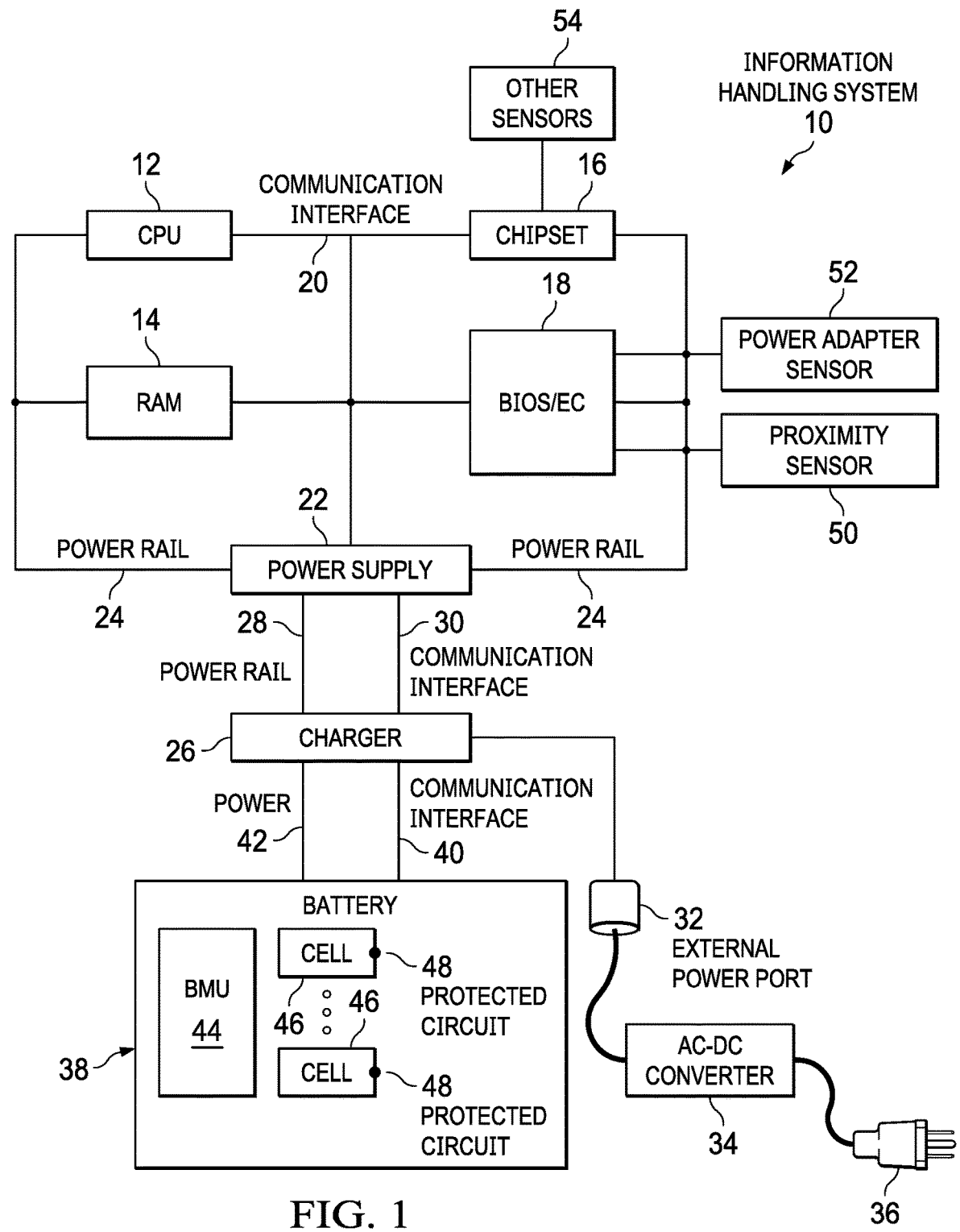
FIG. 1 is a block diagram an example of an Information Handling System (IHS) configured to compensate battery health readings at low temperatures, according to some embodiments.

Referring now to FIG. 1, a block diagram depicts IHS 10 configured to manage battery runtime based upon power source activity. In this example, CPU 12 executes instructions to process information, such as instructions of an OS (e.g., WINDOWS, MACOS, iOS, ANDROID, LINUX, etc.) or application. Random access memory (RAM) 14 stores the instructions and information, such as after retrieval from persistent storage of a hard disk drive or solid-state drive. Chipset 16 interfaces with CPU 12 to manage CPU operations, such as clock speed and power consumption. As an example, chipset 16 may include a Platform Controller Hub (PCH) that supports a processor turbo mode having increased clock speed and power consumption.

BIOS (Basic Input/Output System)/embedded controller (EC) 18 interface with CPU 12 and chipset 16 to coordinate power use and interactions with other physical components, such as networking, peripheral interfaces, etc. BIOS 18 instructions may be stored in a non-volatile memory accessible by chipset 16 via bus 20. Upon powering or restarting IHS 10, CPU 12 may utilize BIOS 18 instructions to initialize and test hardware components coupled to the IHS 10. BIOS 18 instructions may also load an OS for use by IHS 10.

Communication interface 20 provides communication between CPU 12, RAM 14, chipset 16 and BIOS/EC 18, and may include a variety communications links, such as PCI, PCI Express, I2C, SMBus and other wirelines and pins interfaced through a motherboard. In various embodiments, IHS 10 may include a variety of other hardware components, such as networking components, graphics components, an integrated display, etc.

IHS 10 includes power supply 22 that provides regulated power to processing components through one or more power rails 24. Power supply 22 maintains a selected voltage level on power rails 24 to within defined constraints for the processing components by adjusting current to the processing components as power demands shift. In various embodiments, one or more power supplies may feed current to different power rails that meet the constraints of different processing components, such as different rails that have different voltages.

In some embodiments, chipset 16 may interface with power supply 22 and/or EC 18 to communicate expected CPU processing bursts, such as when CPU 12 enters a turbo boost mode. Generally, proper operation of processing components calls for regulated voltage levels with varying current by IHS power supplies 22.

In this example, charger 26 interfaces with power supply 22 through power rail 28 and communication interface 30 to provide power from external power port 32 and/or internal IHS battery 38. During normal operation, charger 26 accepts power from an external power source, such as an AC-DC converter 34 and alternating current source 36 and provides the external power to power supply 22 to power processing components of IHS 10. Charger 26 uses excess power that is not drawn by power supply 22 to charge battery 38 through power interface 42 supported by a communication interface 40.

For example, battery 38 includes battery management unit (BMU) 44 that manages charge and discharge of individual battery cells 46, such as by metering current to battery cells 46. For instance, BMU 44 may include a controller configured to receive a command that sets a maximum charge current. In some embodiments, battery cells 46 are lithium ion battery cells with a nominal voltage of 3.7V that are coupled in series to operate at multiples of the nominal voltage.

Battery charge and protection are managed as a battery pack with individual battery cells 46 having charge parameters monitored by BMU 44 and battery protection enforced by isolating the battery pack in the event of a failure. In an alternative embodiment, each battery cell 46 has a protection circuit 48 that automatically disconnects the battery cell 46 in the event of a battery over voltage or over current event. As an example, battery 38 may include eight cells 46 configured in series and parallel to operate at a nominal voltage of 14.8V, and AC-DC converter 34 may provide current to charger 26 at the nominal voltage so that charger 26 directs power to battery 38 at the nominal voltage when excess power is available based on power supply 22 draw.

When CPU 12 initiates turbo mode with its associated increase in clock speed and current draw, for example, external power port 32 cannot draw adequate power for power supply 22 to maintain voltage constraints of CPU 12. For instance, external power port 32 may be a USB Type C port that has a 100 W power limit, which is less than the maximum power draw of power supply 22—that is, power port 32 is "undersized" with respect to IHS 10. As another example, AC-DC converter 34 may lack power conversion sufficient to fully supply power supply 22 during peak power consumption—in the case of an "undersized" AC adapter.

As used herein, the term "undersized" adapter or power source refers to an adapter or power source that is not capable of delivering the maximum charging rate to the IHS's internal battery under a given usage scenario. Generally, AC adapters and power sources come in all sizes and ratings (e.g., travel adapters, dock adapters, conference room adapters, etc.). Even with the default IHS's AC adapter (i.e., the power adapter that the IHS ships with), however, fast battery charging is not guaranteed unless the IHS is turned off because default adapters cannot run an IHS in performance mode and fast charge the battery simultaneously. In various embodiments, an "undersized" adapter or power source is one that is not large enough to allow the IHS's free running and fast battery charge at the same time—or any usage scenario where the battery is not receiving its maximum charge rate.

In order to operate the processing components during peak power draw, power supply 22 simultaneously draws power from both external power port 32 and battery 38, such as with Dynamic Battery Power Technology (DBPT). When power supply 22 draws the maximum power available for external power port 32, battery 38 is allowed to discharge so that the combined power available from battery 38 and external power port 32 will meet the power demands of power supply 22. Again, in some cases, chipset 16 provides a signal to charger 26, power supply 22, and/or EC 18 to indicate that turbo mode is active.

As illustrated, chipset 16 may utilize a sensor hub or the like (e.g., an Integrated Sensor Hub or "ISH") capable of sampling and/or collecting data from a variety of sensors. For instance, chipset 16 may utilize sensor(s) 54 to measure and collect data describing environmental and operating conditions of IHS 10 (e.g., accelerometers, gyroscopes, hinge sensors, rotation sensors, hall effect sensors, lid sensors, temperature sensors, voltage sensors, current sensors, IR sensors, photosensors, proximity sensors, distance sensors, magnetic sensors, microphones, ultrasonic sensors, global positioning system (GPS), wireless networking (e.g., WiFi, Bluetooth, etc.) sensors, or other radio frequency (RF) sensors (e.g., configured to detect RFID tags), etc.).

In some cases, sensor 54 may be configured to determine the position of IHS 10 with respect to a specific one of a plurality of buildings, offices, cubicles, desks, hallways, corridors, cafeterias, or conference rooms. Additionally, or alternatively, sensor 54 may be configured to determine the position of IHS 10 with respect to a specific one of a plurality of retail establishments, vehicles, airports, airplanes, train stations, or trains.

As illustrated, IHS 10 may utilize embedded controller (EC) 18 that may be a motherboard component of IHS 100 and may include one or more logic units. EC 18 may interface with BMU 44, and it may control maximum clock values, power states (p-state) manager for CPU, GPUs etc. through PECI (processor-to-EC) interface in run-time after initial settings are received from the BIOS (e.g., at boot up).

EC 18 may implement operations for managing power for IHS 10. These operations may be utilized to determine the power status of IHS 10, such as whether IHS 10 is operating from battery power or is plugged into an AC power source (e.g., whether the IHS is operating in AC-only mode, DC-only mode, or AC-plus-DC mode).

Moreover, EC 18 may utilize sensor(s) 54, including optical, infrared, and sonar sensors, that may be configured to provide an indication of a user's presence near IHS 10, absence from IHS 10, and/or physical distance from IHS 10 (e.g., near-field, mid-field, or far-field).

EC 18 may also implement operations for interfacing with power adaptor sensor 52 in managing power for IHS 10. These operations may be utilized to determine the power status of IHS 10, such as whether IHS 10 is operating from battery power or is plugged into an AC power source (e.g., whether the IHS is operating in AC-only mode, DC-only mode, or AC+DC mode). In some embodiments, EC 18 and chipset 16 may communicate with each other, for example, to exchange sensed data, via an out-of-band signaling pathway or bus.

In some cases, adapter 34 may provide output rating information. For example, in legacy barrel adapters, IHS 10 may use the adapter's PSID and a look-up table (LUT) to determine the adapter's ratings. In other examples, an USB-PD controller may negotiate a power delivery contact with IHS 10.

In various embodiments, IHS 10 may not include each of the components shown in FIG. 1. Additionally, or alternatively, IHS 10 may include various other components in addition to those that are shown in FIG. 1. Furthermore, some components that are represented as separate components in FIG. 1 may in certain embodiments instead be integrated with other components. For example, in certain embodiments, all or a portion of the functionality provided by the illustrated components may instead be provided by components integrated into the one or more processor(s) 101 as a systems-on-a-chip.

Figure 2:
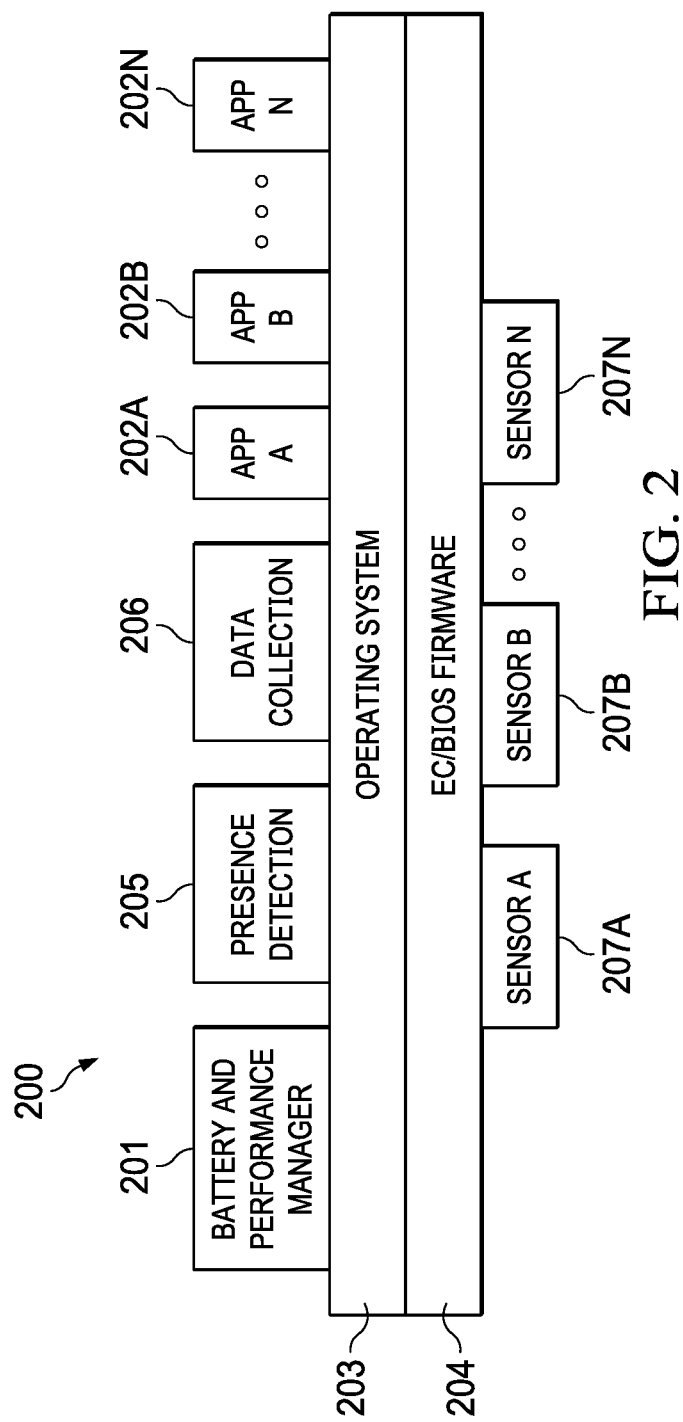
FIG. 2 is a block diagram illustrating an example of a software environment produced by an IHS for compensating battery health readings at low temperatures, according to some embodiments.

FIG. 2 is a block diagram illustrating an example of software environment 200 produced by IHS 10 for compensating battery health readings at low temperatures. In some embodiments, each element of software environment 200 may be provided by IHS 10 through the execution of program instructions by one or more logic components such as, for example, BMU 44, EC 18, and/or CPU 12, stored in memory (e.g., RAM 14), storage device(s), and/or firmware 204.

As shown, software environment 200 includes battery and performance manager 201 configured to manage battery runtime during execution of applications 202A-N. An example of application optimizer engine 201 is the DELL PRECISION OPTIMIZER. Moreover, in various embodiments, battery and performance manager 201 may also implement a method for compensating battery health readings at low temperatures, as described herein.

Examples of applications 202A-N include, but are not limited to: computer graphics software, accounting software, audio player software, computer-aided design editors, data modeling tools, database tools, desktop publishing software, digital audio editors, operating systems, email clients, instant messaging clients, issue tracking systems, mail servers, network monitoring systems, simulation software, raster graphics editors, text editors, vector graphics editors, web server software, word processors, deep-learning software, etc.

Both battery and performance manager 201 and applications 202A-N may be executed by OS 203, which is in turn supported by EC/BIOS instructions or firmware 204. EC/BIOS firmware 204 is in communications with, and configured to receive data collected by, sensor modules or drivers 207A-N—which may abstract and/or interface with proximity sensor(s) 50, power adapter sensor(s) 52, and/or other sensor(s) 54, for example. In other cases, however, at least aspects of battery and performance manager 201, such as instructions for compensating an SOH indicator based upon temperature, may be integrated into EC 18 and/or into BMC 44.

In various embodiments, software environment 200 may also include presence detection module or application programming interface (API) 205 and data collection module or API 206 executed above OS 203. Presence detection module 205 may process user presence data received by one or more of sensor modules 207A-N and it may determine, for example, whether an IHS's end-user is present or absent. Moreover, in cases where the end-user is present before the IHS, presence detection module 205 may further determine a distance of the end-user from the IHS continuously or at pre-determined time intervals. The detected or calculated distances may be used by presence detection module 205 to classify the user as being in the IHS's near-field (user's position<threshold distance A), mid-field (threshold distance A<user's position<threshold distance B, where B>A), or far-field (user's position>threshold distance C, where C>B).

In some cases, battery and performance manager 201 may receive IHS context information using sensors 207A-N including one or more of, for example: user's presence state (e.g., present, near-field, mid-field, far-field, absent), lid state (e.g., of laptop), hinge angle (e.g., between a display portion and a keyboard portion of the IHS), IHS movement (e.g. from an accelerometer or gyroscopic sensor), software application(s) under execution, and meeting/conference information obtained from a calendaring application executed by the IHS.

Data collection engine 206 may include any data collection service or process, such as, for example, the DELL DATA VAULT configured as a part of the DELL SUPPORT CENTER that collects information on system health, performance, and environment. In some cases, data collection engine 206 may receive and maintain a database or table that includes information related to IHS hardware utilization (e.g., by application, by thread, by hardware resource, etc.), power source (e.g., AC-plus-DC, AC-only, or DC-only), IHS location (e.g., GPS coordinates, wireless access point, RFID tags, etc.), and the like.

In some cases, processor(s) 12 may be configured to use context information collected by sensor modules 207A-N to determine the relative orientation and movement of IHS 100. For instance, the sensor hub may utilize inertial movement sensors, that may include accelerometer, gyroscope, and magnetometer sensors, and are capable of determining the current orientation and movement of IHS 10 (e.g., IHS 10 is motionless on a relatively flat surface, IHS 10 is being moved irregularly and is likely in transport, the hinge of IHS 10 is oriented in a vertical direction). In certain embodiments, processor(s) 12 may also determine a location and movement of IHS 10 based on triangulation of network signal and based on network information provided by the OS or network interface. In some embodiments, processor(s) 12 may support additional sensors, such as optical, infrared and sonar sensors, that may provide support for xR (virtual, augmented, and/or mixed reality) sessions hosted by IHS 10 and may be used to provide an indication of a user's presence near IHS 10, such as whether a user is present, absent, and/or facing a display.

In embodiments where IHS 10 may support multiple physical configurations, such as a convertible laptop, N-in-1 device, or the like, processor(s) 12 may utilize one or more of sensor modules 207A-N that collect readings that may be used in determining the current posture in which IHS 10 is physically configured. In certain embodiments, such posture determinations may be additionally made using the movement and orientation information provided by sensor modules 207A-N.

In laptop and convertible laptop embodiments, for example, processor(s) 12 may utilize a lid position sensor module to determine the relative angle between the two panels of the laptop in order to determine the mode in which IHS 10 is physically configured. In such embodiments, sensor modules 207A-N may measure the angle of rotation of the hinge that connects the base panel and lid panel of IHS 10. In some cases, processor(s) 10 may collect lid position information, such as the hinge angle, to then use in determining the posture in which IHS 10 is configured.

Processor(s) 12 may determine the posture of IHS 10 based, at least in part, on the angle of rotation of the hinge of IHS 10 from a closed position. A first range of hinge angles from a closed position may indicate a laptop posture, a second range of hinge angles may indicate a landscape posture and a third range of angles may indicate a tablet posture. Processor(s) 12 may additionally utilize orientation and movement information collected from inertial movement sensors to further determine the posture in which IHS 10 is physically configured.

For instance, if processor(s) 12 determine that IHS 10 is configured with a hinge angle of a laptop configuration, but IHS 10 is oriented on its side, IHS 10 may be determined to be in a book mode. If IHS 10 is determined to be tilted such that the hinge is oriented between horizontal and vertical, the user's face is detected to be facing the integrated display, and IHS 10 is experiencing slight movement, processor(s) 101 may determine that IHS 10 is being used in a book posture. Processor(s) 12 may determine that IHS 10 is opened to a 180-degree hinge angle and lies on a flat surface, thus indicating that IHS 10 it is being used in a landscape posture. Processor(s) 12 may similarly determine that IHS 10 is in a tent configuration, in response to detecting a hinge angle within a defined range, such as between 300 and 345 degrees, such that the hinge is aligned horizontally and is higher than both display panels of IHS 10.

In some cases, battery suppliers can derive performance curves for the cell type that they are using to build the battery packs (e.g., 2S/3S/4S). By measuring a battery's performance curves, battery manufacturers can measure temperature-induced variation in cell capacity due to cell impedance changes over a full operational temperature range. This temperature factor may be either implemented as an equation or formula calculated by BMU 44, or as a lookup table (LUT).

As noted, one way to determine battery health is to compare full charge capacity after a charge cycle with the original factory design capacity. To do this, systems and methods described herein may take into consideration the temperatures in effect during the charge cycle in order to more accurately model and compensate for the temperature variations that might have occurred during the charge cycle.

In some cases, compensation may be calculated as a piecewise linear approximation by tracking the temperature readings at different values of battery capacity or Relative State of Charge (RSOC). For example, temperature readings may be taken at 100%, 75%, 50%, 25%, and 7% battery capacity checkpoints. The average temperature for compensation purposes may be taken as the average of temperature readings at those capacity checkpoints. When a full charge is reached as indicated by an internal BMU flag, the measured full charge capacity may be compensated by the temperature factor calculation or lookup table at the average temperature measured over the battery charging process.

A feature of the systems and methods described herein is that they may be implemented without additional hardware cost; only firmware changes are needed on BMU 44 and/or EC 18. Moreover, end-users may avoid false alarms about battery health dropping significantly when their systems operate in lower temperature environments.

Figure 3:
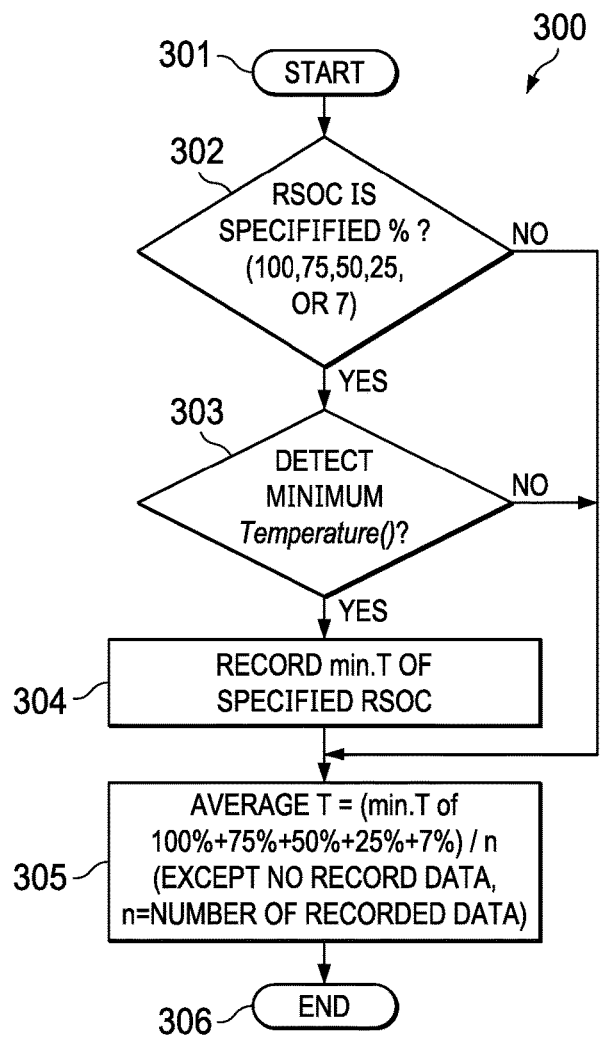
FIG. 3 is a flowchart illustrating an example of a method for calculating an average temperature factor, according to some embodiments.

FIG. 3 is a flowchart illustrating an example of method 300 for calculating an average temperature factor. In some embodiments, method 300 may be executed by EC 18, BMC 44, and/or CPU 12. Particularly, method 300 starts at block 301. At block 302, method 300 determines whether selected RSOC checkpoints have been reached for temperature measurements (e.g., 100%, 75%, 50%, 25%, and/or 7%). If not, method 300 skips to block 305.

Conversely, if a selected RSOC checkpoint has been reached, block 303 detects a current ambient temperature at the checkpoint and/or a minimum temperature reached between checkpoints. Block 304 records the measured temperature at every checkpoint, and block 305 calculates an average of the temperature readings. In some cases, the average temperature across checkpoints may be calculated a linear average or approximation. Method 300 ends at block 306.

Figure 4:
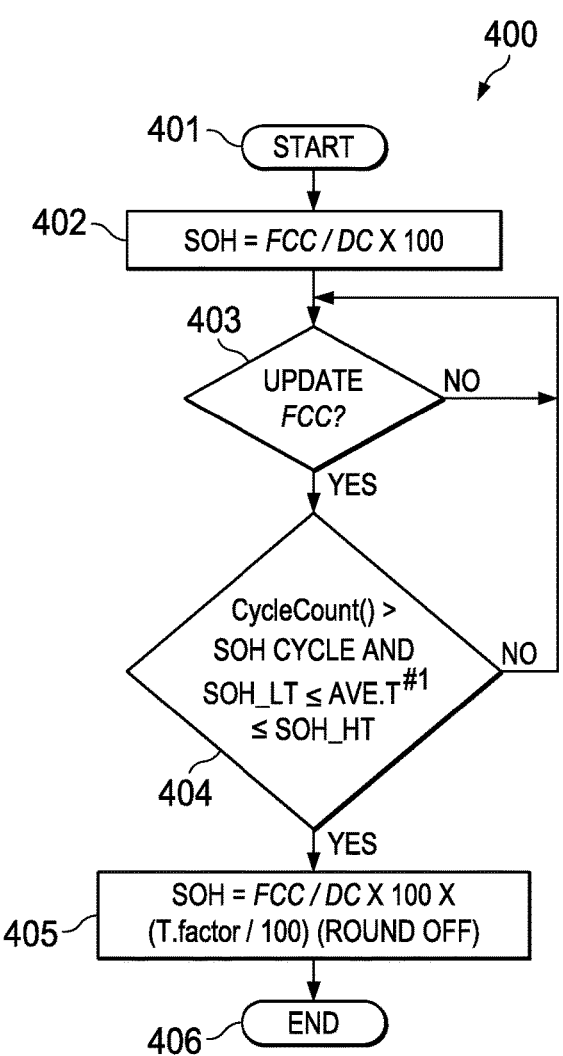
FIG. 4 is a graph illustrating an example of a method for calculating a compensated state of health (SOH) indicator, according to some embodiments.

FIG. 4 is a graph illustrating an example of method 400 for calculating a compensated state of health (SOH) indicator. In some embodiments, method 400 may be executed by EC 18, BMC 44, and/or CPU 12. Particularly, method 400 starts at block 401. At block 402, a SOH indicator is calculated as the battery's full charge capacity (FCC) divided by the battery's design capacity (DC) multiplied by 100 (to yield an SOH percentage).

At block 403, method 400 determines whether to update the FCC. If so, block 404 determines whether a cycle count index is great than an SOH cycle and whether the average temperature calculated or selected in block 305 of method 300 is between selected low and high SOH temperatures SOH_LT and SOH_HT, respectively. In other words, method 400 sets the high and low temperature thresholds to check if the average temperate is within this those boundaries.

If so, block 405 may update and/or compensate the SOH calculation of block 402 and/or report it to a user as a compensated SOH value equal to (FCC/DC×100)×temperature_factor/100). Method 400 ends at block 406.

FIG. 5 is table illustrating example parameter settings 500, according to some embodiments. Particularly, parameter settings 500 include firmware SOH test parameters and conditions set as shown. Parameter settings 500 provide temperature boundaries that yield the correlation between temperature and capacity degradation. In this example, at 24° C. there is 100% capacity, and at 5° C. there is 80% capacity. This model can then use a linear interpolation to calculate the remaining capacity once the average temperature is calculated by block 305.

FIG. 6 shows a table illustrating example test results 600, according to some embodiments. Specifically, test results 600 show that at 5° C. the compensation techniques described herein significantly improve the accuracy of the battery's SOH reading. In some cases, the battery may report the SOH factor, FCC, and SOH. Moreover, the test may for example run 3 cycles at 5° C. to get these factors reported to the EC for OS information delivery. Results may be capped at 100% if the "calculative SOH" is over 100%. During cycles 1 thought 3, the FCC reported number may also be updated, and at the end of cycle 3, the reported SOH represents the calculative SOH with rounded results of 96%. In comparison, in the absence of the compensation techniques described herein, the SOH would be calculated as 82%.

Figure 7:
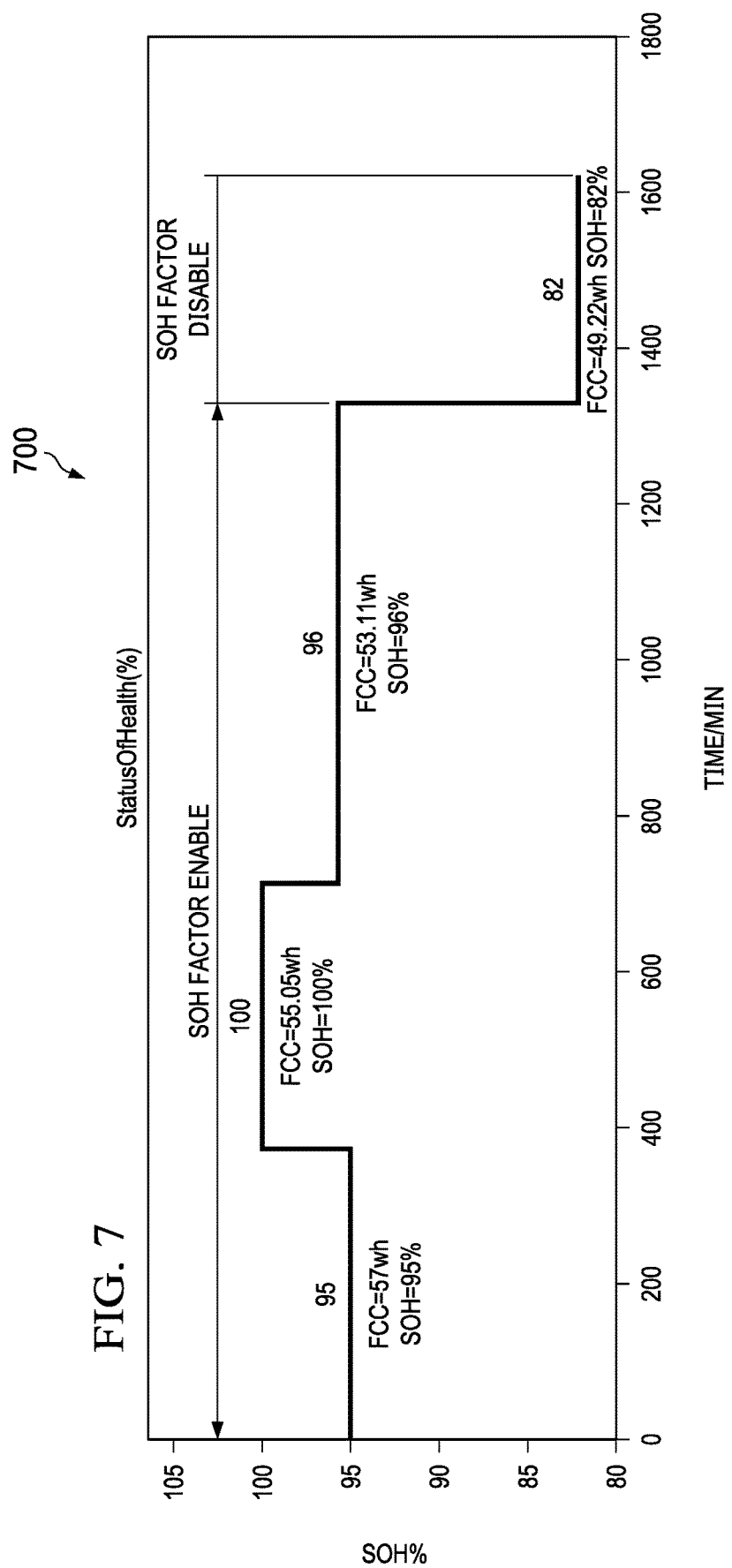
FIG. 7 is a graph illustrating examples of battery health readings with and without compensation, according to some embodiments.

FIG. 7 shows graph 700 illustrating examples of battery health readings with and without compensation, according to some embodiments. As shown, when methods 300 and 400 are executed by EC 18, BMC 44, and/or CPU 12, SOH reporting with compensation enabled shows a greater SOH indicator (compensated SOH=95%, 100%, or 96%) than when compensation is disabled (SOH=FCC/DC=49.22/60× 100=82%).

It should be understood that various operations described herein may be implemented in software executed by processing circuitry, hardware, or a combination thereof. The order in which each operation of a given method is performed may be changed, and various operations may be added, reordered, combined, omitted, modified, etc. It is intended that the invention(s) described herein embrace all such modifications and changes and, accordingly, the above description should be regarded in an illustrative rather than a restrictive sense.

The terms "tangible" and "non-transitory," as used herein, are intended to describe a computer-readable storage medium (or "memory") excluding propagating electromagnetic signals; but are not intended to otherwise limit the type of physical computer-readable storage device that is encompassed by the phrase computer-readable medium or memory. For instance, the terms "non-transitory computer readable medium" or "tangible memory" are intended to encompass types of storage devices that do not necessarily store information permanently, including, for example, RAM. Program instructions and data stored on a tangible computer-accessible storage medium in non-transitory form may afterwards be transmitted by transmission media or signals such as electrical, electromagnetic, or digital signals, which may be conveyed via a communication medium such as a network and/or a wireless link.

Although the invention(s) is/are described herein with reference to specific embodiments, various modifications and changes can be made without departing from the scope of the present invention(s), as set forth in the claims below. Accordingly, the specification and figures are to be regarded in an illustrative rather than a restrictive sense, and all such modifications are intended to be included within the scope of the present invention(s). Any benefits, advantages, or solutions to problems that are described herein with regard to specific embodiments are not intended to be construed as a critical, required, or essential feature or element of any or all the claims.

Unless stated otherwise, terms such as "first" and "second" are used to arbitrarily distinguish between the elements such terms describe. Thus, these terms are not necessarily intended to indicate temporal or other prioritization of such elements. The terms "coupled" or "operably coupled" are defined as connected, although not necessarily directly, and not necessarily mechanically. The terms "a" and "an" are defined as one or more unless stated otherwise. The terms "comprise" (and any form of comprise, such as "comprises" and "comprising"), "have" (and any form of have, such as "has" and "having"), "include" (and any form of include, such as "includes" and "including") and "contain" (and any form of contain, such as "contains" and "containing") are open-ended linking verbs. As a result, a system, device, or apparatus that "comprises," "has," "includes" or "contains" one or more elements possesses those one or more elements but is not limited to possessing only those one or more elements. Similarly, a method or process that "comprises," "has," "includes" or "contains" one or more operations possesses those one or more operations but is not limited to possessing only those one or more operations.

The invention claimed is:

1. An Information Handling System (IHS), comprising:
a processor; and
a memory coupled to the processor, the memory having program instructions stored thereon that, upon execution by the processor, cause the IHS to:
calculate a state-of-health (SOH) of a battery;
measure two or more temperature readings at different values of Relative State of Charge (RSOC) during a charge cycle;
calculate an average of the two or more temperature readings;
calculate or select a temperature factor based on the average, wherein the temperature factor is derived from performance curves indicating temperature-induced variation in cell capacity due to cell impedance changes over a temperature range; and
multiply the SOH by the temperature factor to compensate the SOH.

2. The IHS of claim 1, wherein the processor comprises an embedded controller (EC).

3. The IHS of claim 1, wherein the processor comprises a Battery Management Unit (BMU).

4. The IHS of claim 1, wherein to calculate the SOH, the program instructions, upon execution, cause the IHS to divide a present charge capacity after a full charge cycle by an original charge capacity.

5. The IHS of claim 1, wherein the different values of RSOC comprise: 100%, 75%, 50%, 25%, and 7%.

6. A method, comprising:
calculating a state-of-health (SOH) of a battery;
measuring two or more temperature readings at different values of Relative State of Charge (RSOC);
calculating an average of the two or more temperature readings;
calculating or select a temperature factor based on the average, wherein the temperature factor is derived from performance curves indicating temperature-induced variation in cell capacity due to cell impedance changes over a temperature range; and
multiplying the SOH by the temperature factor to compensate the SOH.

7. The method of claim 6, wherein calculating the SOH further comprises dividing a present charge capacity after a full charge cycle by an original charge capacity.

8. The method of claim 6, wherein the different values of RSOC comprise: 100%, 75%, 50%, 25%, and 7%.

9. The method of claim 6, wherein the measuring, calculating, and multiplying operations are performed, at least in part, by an embedded controller (EC).

10. The method of claim 6, wherein the measuring, calculating, and multiplying operations are performed, at least in part, by a Battery Management Unit (BMU).

11. A memory storage device having program instructions stored thereon that, upon execution by one or more processors of an Information Handling System (IHS), cause the IHS to:
calculate a state-of-health (SOH) of a battery;
measure two or more temperature readings at different values of Relative State of Charge (RSOC) during a charge cycle;
calculate an average of the two or more temperature readings;
calculate or select a temperature factor based on the average, wherein the temperature factor is derived from performance curves indicating temperature-induced variation in cell capacity due to cell impedance changes over a temperature range; and
multiply the SOH by the temperature factor to compensate the SOH.

12. The memory storage device of claim 11, wherein the processor comprises an Embedded Controller (EC).

13. The memory storage device of claim 11, wherein to calculate the SOH, the program instructions, upon execution, cause the IHS to divide a present charge capacity after a full charge cycle by an original charge capacity.

14. The memory storage device of claim 11, wherein the processor comprises a Battery Management Unit (BMU).

15. The memory storage device of claim 11, wherein the different values of RSOC comprise: 100%, 75%, 50%, 25%, and 7%.

* * * * *